(12) United States Patent
Shackleton et al.

(10) Patent No.: US 8,021,594 B2
(45) Date of Patent: Sep. 20, 2011

(54) PRESERVING FILLED FEATURES WHEN VACUUM WIPING

(75) Inventors: Steven C. Shackleton, Austin, TX (US);
Pankaj B. Lad, DeSoto, TX (US); Ian Matthew McMackin, Austin, TX (US);
Frank Y. Xu, Round Rock, TX (US);
Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/488,642

(22) Filed: Jun. 22, 2009

(65) Prior Publication Data

US 2009/0256289 A1 Oct. 15, 2009

Related U.S. Application Data

(63) Continuation of application No. 11/694,193, filed on Mar. 30, 2007, now abandoned, application No. 12/488,642, which is a continuation-in-part of application No. 11/127,041, filed on May 11, 2005, now Pat. No. 7,727,453.

(60) Provisional application No. 60/788,778, filed on Apr. 3, 2006.

(51) Int. Cl.
*B29C 35/08* (2006.01)
*B29C 59/02* (2006.01)

(52) U.S. Cl. ............... 264/496; 425/174.4; 425/385; 264/319; 264/294

(58) Field of Classification Search .......... 264/496, 264/316, 294, 319; 425/174.4, 385; 977/887
See application file for complete search history.

(56) References Cited

U.S. PATENT DOCUMENTS

| | | | | |
|---|---|---|---|---|
| 3,644,396 | A * | 2/1972 | Aller | 548/556 |
| 5,217,654 | A * | 6/1993 | Buckley | 264/478 |
| 5,281,373 | A * | 1/1994 | Tamura et al. | 264/1.33 |
| 5,693,375 | A * | 12/1997 | Sato et al. | 427/522 |
| 7,641,467 | B2 * | 1/2010 | Kruijt-Stegeman et al. | 425/385 |
| 7,641,840 | B2 * | 1/2010 | Choi et al. | 264/299 |
| 7,654,815 | B2 * | 2/2010 | Hasegawa et al. | 425/363 |
| 7,654,816 | B2 * | 2/2010 | Chen | 425/385 |
| 7,704,425 | B2 * | 4/2010 | Heidari et al. | 264/220 |
| 2005/0186515 | A1 * | 8/2005 | Watkins | 430/322 |
| 2009/0028910 | A1 * | 1/2009 | DeSimone et al. | 424/401 |
| 2010/0140850 | A1 * | 6/2010 | Napadensky et al. | 264/401 |
| 2010/0271449 | A1 * | 10/2010 | Kusunoki | 347/102 |
| 2011/0070372 | A1 * | 3/2011 | Faucher et al. | 427/256 |

OTHER PUBLICATIONS

Bao, J. Vac. Sci. Technol. B, vol. 20, No. 6 (Nov./Dec. 2002), (pp. 2881-2886 ).*
Bao, J. Vac. Sci. Technol. B, vol. 21, No. 6 (Nov./Dec. 2003), p. 2749.*

* cited by examiner

*Primary Examiner* — Joseph Del Sole
*Assistant Examiner* — Nahida Sultana
(74) *Attorney, Agent, or Firm* — Cameron A. King

(57) ABSTRACT

A method/process for curing imprint on a template prior to contact with a substrate. A curing process is used to adhere the imprint to a wafer or substrate. Monomer is deposited on a template and then partially cured using a UV exposure. The exposure is controlled so that the imprint is cured past the gel point, but still retains a thin liquid layer of uncured monomer at the surface that will bond with the wafer. Further, this partially cured layer enables the alignment adjustments between the template and the substrate to be performed after contact between the two without pulling any monomer out of the features.

11 Claims, 3 Drawing Sheets

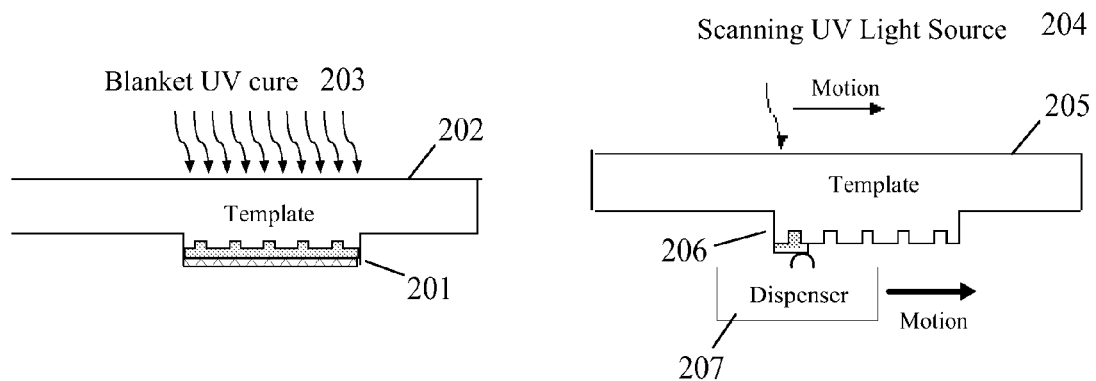
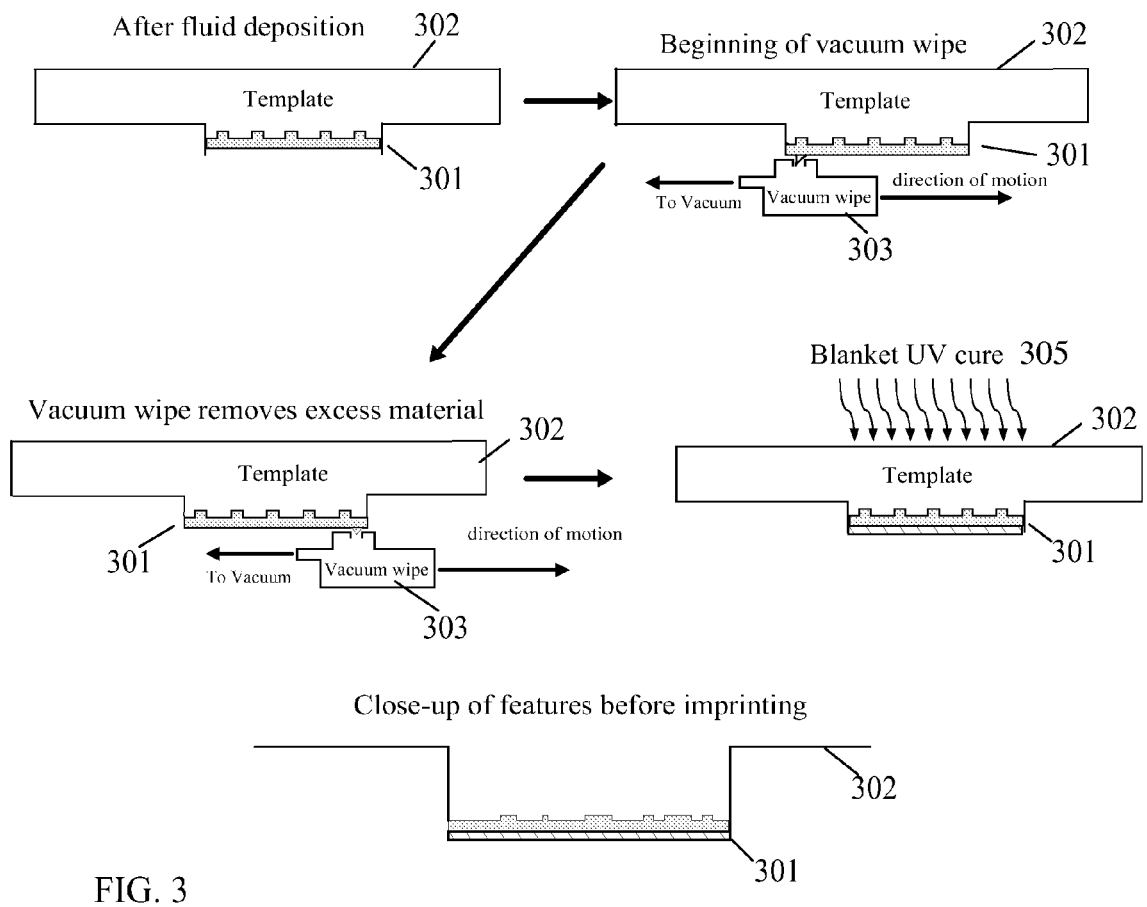
FIG. 3

PRESERVING FILLED FEATURES WHEN VACUUM WIPING

This application is a Continuation of U.S. patent application Ser. No. 11/694,193 filed on Mar. 30, 2007, now abandoned which claims priority to U.S. provisional application 60/788,778 filed on Apr. 3, 2006. This application is also a Continuation-In-Part of U.S. patent application Ser. No. 11/127,041 filed on May 11, 2005, now U.S. Pat. No. 7,727,453 which claims priority to U.S. patent application Ser. No. 10/194,991 filed on Jul. 11, 2002 (now U.S. Pat. No. 7,077,992). All of the above referenced applications are hereby incorporated by reference herein.

BACKGROUND INFORMATION

The field of the invention relates generally to nano-fabrication of structures. More particularly, the present invention is directed to a method of curing imprint material on the template.

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent publication 2004/0065976 filed as U.S. patent application Ser. No. 10/264,960, entitled, "Method and a Mold to Arrange Features on a Substrate to Replicate Features having Minimal Dimensional Variability"; U.S. patent publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and all of which are incorporated by reference herein.

The fundamental imprint lithography technique disclosed in each of the aforementioned U.S. patent publications and U.S. patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

BRIEF DESCRIPTION OF DRAWINGS

FIG. 2 illustrates methods or steps of curing to form a partially cured film;

FIG. 3 illustrates methods or steps for forming a thin, gelled monomer film.

DETAILED DESCRIPTION

Figure 1:
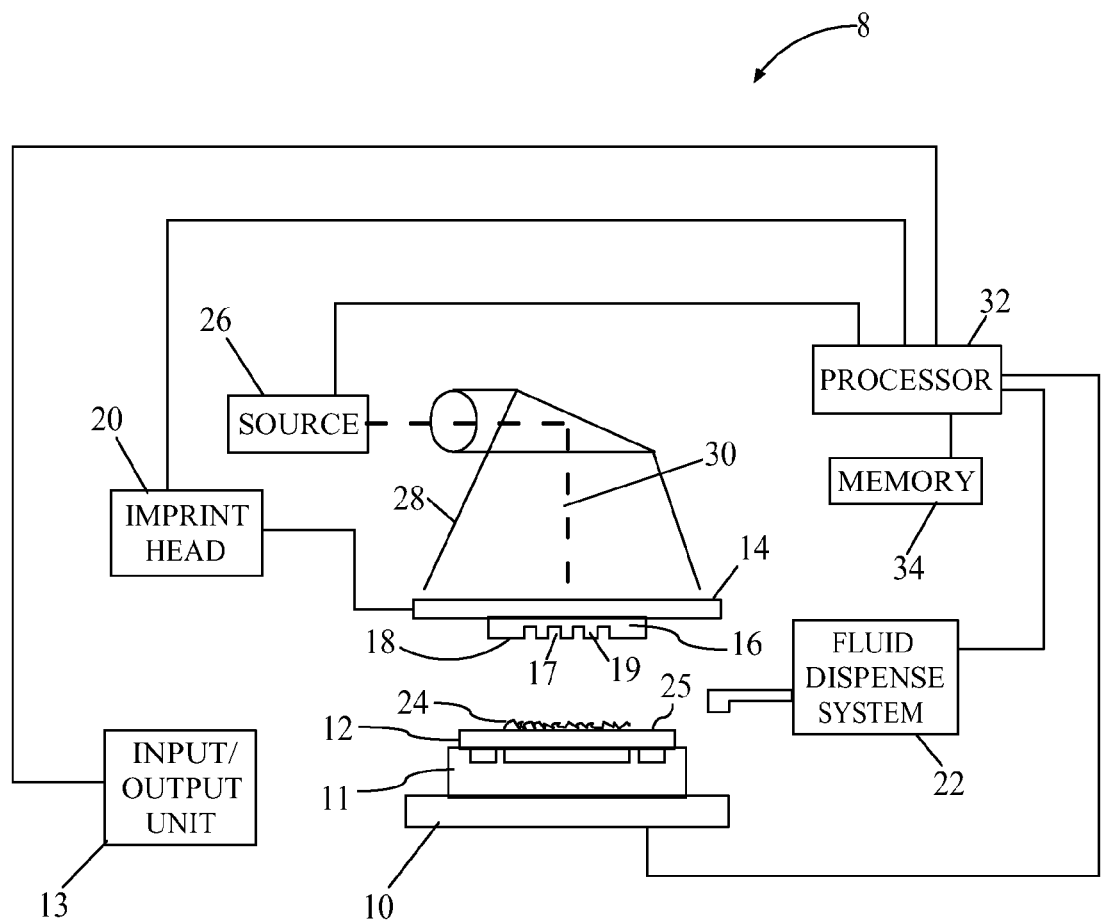
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported, and a template 14 having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from materials including, but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymerizable material 24 thereon. It should be understood that polymerizable material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymerizable material 24.

Referring to FIG. 1, typically, polymerizable material 24 is disposed upon substrate 12 before the desired volume is defined between mold 16 and substrate 12. However, polymerizable material 24 may fill the volume after the desired volume has been obtained. After the desired volume is filled with polymerizable material 24, source 26 produces energy 28, e.g., broadband energy that causes polymerizable material 24 to solidify and/or cross-link conforming to the shape of a surface 25 of substrate 12 and patterning surface 18, defining a patterned layer 50 on substrate 12.

The broadband energy may comprise an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process may be regulated by a processor 32 that is in data communication with stage 10, imprint head 20, fluid dispense system 22, source 26, operating on a computer readable program stored in memory 34.

In imprinting, a monomer can flow out of the active area and create monomer extrusions. The extrusions can impede subsequent imprinting, become a source of particle contamination, and cause comets to form in subsequent spin coating process steps.

Further, when attempting to create thin fluid films by a vacuum wiping monomer dispensed on the surface of a template, fluid may be extracted from some features. Also, it has been observed that when a template with a contiguous monomer film was brought into contact with a wafer to form an imprint, some of the monomer contained within the features was drawn out of the features and into the formation of the residual layer. Once the residual layer of fluid surrounding the features had reached equilibrium, fluid began to fill the features that had been evacuated.

Disclosed herein is a method/process for curing imprint on a template prior to contact with a substrate. A curing process is used to adhere the imprint to a wafer or substrate. Monomer is deposited on a template and then partially cured using a UV exposure. The exposure is controlled so that the imprint is cured past the gel point, but still retains a thin liquid layer of uncured monomer at the surface that will bond with the wafer. Further, this partially cured layer enables the alignment adjustments between the template and the substrate to be performed after contact between the two without pulling any monomer out of the features.

The retention of a thin liquid monomer layer is aided by oxygen poisoning that inhibits curing of monomer exposed to air. The viscosity of the bulk of the monomer is increased by the partial cure slowing any further flow. After the partial cure is complete, the liquid monomer surface is brought into contact with the wafer, and the imprint is fully cured by a second exposure of UV light. The imprint is adhered to the wafer by this curing step.

Imprinting in this manner may be achieved in the following ways:

Referring to FIG. 2A, a contiguous film of monomer 201 is deposited on the template 202 filling all the features. A blanket UV light exposure 203 may be used to achieve the partial cure. Alternatively, referring to FIG. 2B, a scanning UV light 206 that follows behind the monomer 204 dispenser 207 may be employed to partially cure the monomer shortly after it is deposited on the template 205.

Referring to FIG. 3, a contiguous film of monomer 301 is deposited on the template 302 filling all the features. A vacuum wipe 303 may be used to remove excess monomer. A blanket UV light exposure 305 may be used to achieve the partial cure, such as in FIG. 2A. Alternatively, similar to FIG. 2B, a scanning UV light that follows behind the vacuum wipe may be employed to partially cure the monomer shortly after the wipe passes over the template.

Figure 4:
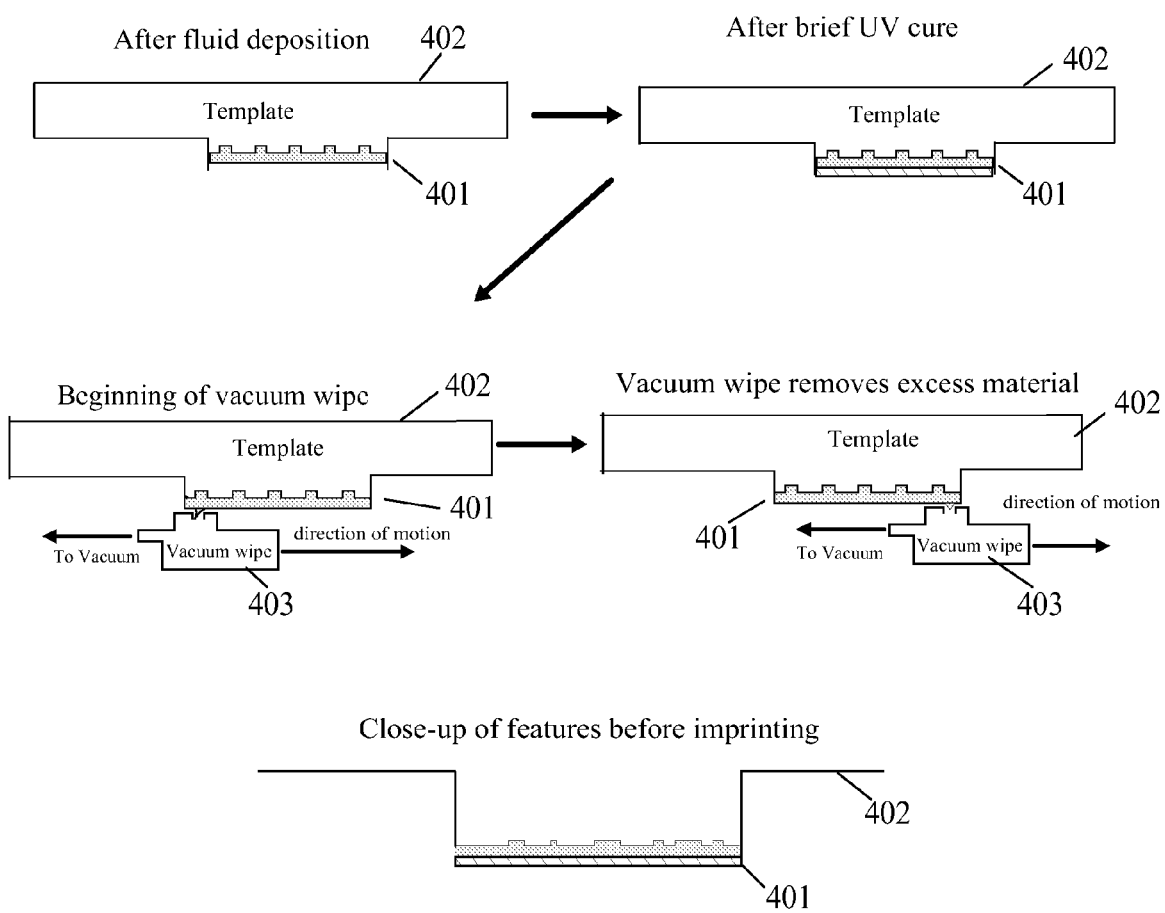
FIG. 4 illustrates a process of curing to preserve features before vacuum wiping.

Referring to FIG. 4, a contiguous film of monomer 401 is deposited on the template 402 filling all the features. A short blanket UV light exposure (not shown) is used to achieve the partial cure (similar to FIG. 2A), such that only the monomer 401 in the template features is gelled. A vacuum wipe 404 is used to remove excess monomer 401.

Alternatively, two initiators, A and B, may be incorporated into the monomer (e.g., any of monomers 201, 301, 401). Initiators A and B are sensitive to different wavelengths of UV light. Initiator A is used to achieve the full cure of the imprint in the standard manner, while initiator B is incorporated at a much lower concentration than A, and the partial cure of the imprint is achieved by exposing the monomer with UV light at the wavelength for which initiator B is sensitive. This method may give increased control over the partial cure of the monomer.

The material (e.g., any of monomers 201, 301, 401) employed in embodiments of the present invention may be composed of a variety of polymerizable materials. Generally, any photopolymerizable material may be used. Photopolymerizable materials may include a mixture of monomers and a photoinitiator. In some embodiments, the curable liquid may include one or more commercially available negative photoresist materials. Viscosity of the photoresist material may be reduced by diluting the liquid photoresist with a suitable solvent.

In an embodiment, a suitable curable liquid (e.g., any of monomers 201, 301, 401) comprises a monomer, a silylated monomer, and an initiator. A crosslinking agent and a dimethyl siloxane derivative may also be included. Monomers (e.g., any of monomers 201, 301, 401) include, but are not limited to, acrylate and methacylate monomers. Examples of monomers (e.g., any of monomers 201, 301, 401) include, but are not limited to, butyl acrylate, methyl acrylate, methyl methacrylate, or mixtures thereof. The monomer makes up approximately 25 to 50% by weight of the curable liquid. The monomer may ensure adequate solubility of the photoinitiator in the curable liquid. The monomer may provide adhesion to an underlying organic transfer layer, when used.

The curable liquid may also comprise a silylated monomer. Silylated monomers in general are polymerizable compounds that include a silicon group. Classes of silylated monomers include, but are not limited to, silane acrylyl and silane methacrylyl derivatives. Specific examples include methacryloxypropyl tris(tri-methylsiloxy)silane and (3-acryloxypropyl) tris(tri-methoxysiloxy)-silane. Silylated monomers may be present in amounts from 25 to 50% by weight. The curable liquid may also include a dimethyl siloxane derivative. Examples of dimethyl siloxane derivatives include, but are not limited to, (acryloxypropyl) methylsiloxane dimethylsiloxane copolymer, acryloxypropyl methylsiloxane homopolymer, and acryloxy terminated polydimethylsiloxane. Dimethyl siloxane derivatives are present in amounts from about 0 to 50% by weight. The silylated monomers and the dimethyl siloxane derivatives may impart a high oxygen etch resistance to the cured liquid. Additionally, both the silylated monomers and the dimethyl siloxane derivatives may reduce the surface energy of the cured liquid, therefore increasing the ability of the template to release from the surface. The silylated monomers and dimethyl siloxane derivatives listed herein are all commercially available from Gelest, Inc.

Any material that may initiate a free radical reaction may be used as the initiator. For activating light curing of the curable material, the initiator may be a photoinitiator. Examples of initiators include, but are not limited to, alpha-hydroxyketones (e.g., 1-hydroxycyclohexyl phenyl ketone, sold by Ciba-Geigy Specialty Chemical Division as Irgacure 184), and acylphosphine oxide initiators (e.g., 1-henylbis(2, 4,6-trimethyl benzoyl) phosphine oxide, sold by Ciba-Geigy Specialty Chemical Division as Irgacure 819.

The curable liquid may also comprise a crosslinking agent. Crosslinking agents are monomers that include two or more polymerizable groups. In one embodiment, polyfunctional siloxane derivatives may be used as a crosslinking agent. An example of a polyfunctional siloxane derivative is 1,3-bis(3-methacryloxypropyl)-tetramethyl disiloxane.

In one example, a curable liquid may comprise a mixture of 50% by weight of n-butyl acrylate and 50% (3-acryloxypropyl) tris-trimethylsiloxane-silane. To this mixture 3% by weight mixture of a 1:1 Irgacure 819 and Irgacure 184 and 5% of the crosslinker 1,3-bis(3-methacryloxypropyl)-tetramethyl disiloxane may be added. The viscosity of this mixture is less than 30 cps measured at about 25° C.

The material may also be the material as described in BAILEY ET AL., Step and Flash Imprint Lithography: Template Surface Treatment and Defect Analysis, Journal of Vacuum Science, B 18(6), pp. 3572-3577 Nov. 1, 2000, which is incorporated by reference herein.

The present invention provides a means of preventing material from flowing out of the active area and the features when imprinting. The capillary force exerted on the monomer when it is laminated between the template and wafer is not present in an open film on the template. Hence, the monomer is retained, where it was deposited, within the active area of the template. By partially curing, further flow of the monomer is greatly restricted. The fill time may be reduced to the amount of time required to dispense the monomer and partially cure. The only time-limiting step in imprinting would then be the duration of time required to form a uniform residual layer free of trapped air. Furthermore, previous experiments have shown that rapid, uniform imprints may be created by featureless blank mesa templates and thin fluid residual layers. The process proposed above may transform any template, regardless of features density and size, into a featureless template.

Embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

The invention claimed is:

1. In a nano-imprint lithography system, a method comprising:
    depositing a monomer on a template having a pattern of nano-dimensional features to imprint into the monomer;
    curing the monomer with UV light in a manner that leaves a thin layer of the monomer not fully cured, resulting in a partially cured monomer;
    contacting a substrate to the partially cured monomer so that the thin layer of the monomer not fully cured bonds to the substrate;
    performing a second curing of the monomer to complete curing of the partially cured monomer resulting in a fully cured monomer; and,
    separating the fully cured monomer from the template.

2. The method as recited in claim 1, further comprising vacuum wiping the monomer after it is deposited on the template to remove excess monomer.

3. The method as recited in claim 1, wherein the monomer is deposited on the template in a scanning manner from one end of the template to the other end, and the UV light is scanned over the monomer as it is deposited in order to cure the monomer.

4. The method as recited in claim 2, wherein the vacuum wiping is performed in a scanning manner from one end of the template to the other end, and the curing step is performed by scanning the UV light over the monomer by following the scanning of the vacuum wiping.

5. The method as recited in claim 1, wherein the monomer is deposited on the template so that all of the nano-dimensional features are filled with the monomer.

6. The method as recited in claim 1, wherein the monomer comprises two separate initiators, whereby a first of the two separate initiators cures at a faster rate than a second of the two separate initiators.

7. The method as recited in claim 6, wherein the first curing process partially cures the monomer by curing a portion of the monomer containing the first of the two separate initiators.

8. In a nano-imprint lithography system, a method comprising:
    depositing a monomer on a template having a pattern of nano-dimensional features to imprint into the monomer, wherein the monomer comprises two separate initiators, whereby a first of the two separate initiators cures at a faster rate than a second of the two separate initiators;
    curing the monomer with UV light in a manner that cures a portion of the monomer containing the first of the two separate initiators leaving a thin layer of the monomer not fully cured, resulting in a partially cured monomer;
    contacting a substrate to the partially cured monomer so that the thin layer of the monomer not fully cured bonds to the substrate; and
    performing a second curing of the monomer with the UV light in a manner that cures a portion of the monomer containing the second of the two separate initiators, resulting in a fully cured monomer.

9. The method as recited in claim 8, further comprising vacuum wiping the monomer after it is deposited on the template to remove excess monomer.

10. The method as recited in claim 8, wherein the monomer is deposited on the template in a scanning manner from one end of the template to the other end, and the UV light is scanned over the monomer as it is deposited in order to cure the monomer.

11. The method as recited in claim 9, wherein the vacuum wiping is performed in a scanning manner from one end of the template to the other end, and the curing step is performed by scanning the UV light over the monomer by following the scanning of the vacuum wiping.

* * * * *